US010948246B1

(12) United States Patent
Hsien et al.

(10) Patent No.: US 10,948,246 B1
(45) Date of Patent: Mar. 16, 2021

(54) HEAT DISSIPATION SYSTEM

(71) Applicants: INVENTEC (PUDONG) TECHNOLOGY CORPORATION, Shanghai (CN); INVENTEC CORPORATION, Taipei (TW)

(72) Inventors: Shin-Hsin Hsien, Taipei (TW); Chih-Kai Yang, Taipei (TW)

(73) Assignees: INVENTEC (PUDONG) TECHNOLOGY CORPORATION, Shanghai (CN); INVENTEC CORPORATION, Taipei (TW)

( * ) Notice: Subject to any disclaimer, the term of this patent is extended or adjusted under 35 U.S.C. 154(b) by 0 days.

(21) Appl. No.: 16/694,947

(22) Filed: Nov. 25, 2019

(30) Foreign Application Priority Data

Sep. 12, 2019 (CN) .......................... 201910865546.6

(51) Int. Cl.
| | | |
|---|---|---|
| *F28F 3/02* | (2006.01) | |
| *H01L 23/427* | (2006.01) | |
| *H01L 23/367* | (2006.01) | |
| *F28D 15/04* | (2006.01) | |
| *F28D 15/00* | (2006.01) | |

(Continued)

(52) U.S. Cl.
CPC .............. *F28F 3/025* (2013.01); *F28D 15/00* (2013.01); *F28D 15/0266* (2013.01); *F28D 15/04* (2013.01); *F28D 15/043* (2013.01); *H01L 23/3672* (2013.01); *H01L 23/427* (2013.01); *G06F 1/203* (2013.01); *H01L 23/467* (2013.01); *H05K 7/20136* (2013.01)

(58) Field of Classification Search
CPC . H01L 23/427; H01L 23/467; H01L 23/3672; H01L 2224/48091; H01L 23/473; H01L 23/367; H01L 35/32; H01L 23/3677; H01L 23/4093; H01L 2224/0401; H01L 2224/16225; F28D 15/0266; F28D 15/04; F28D 15/00; F28D 15/043; F28D 2021/0029; G06F 1/203; H05K 7/20336; H05K 7/20172; H05K 7/20154; H05K 7/2039; H05K 1/0203; H05K 7/20136
See application file for complete search history.

(56) References Cited

U.S. PATENT DOCUMENTS

| | | | | |
|---|---|---|---|---|
| 6,653,755 | B2 * | 11/2003 | Machiroutu | .......... F04D 17/127 310/40 R |
| 2003/0016495 | A1 * | 1/2003 | Hongo | .................... G06F 1/203 361/679.48 |

(Continued)

*Primary Examiner* — Adam B Dravininkas
(74) *Attorney, Agent, or Firm* — Maschoff Brennan

(57) ABSTRACT

A heat dissipation system configured to be in thermal contact with a heat source. The heat dissipation system includes a centrifugal fan, a heat pipe, a heat dissipater, and a heat conduction assembly. The centrifugal fan includes a housing and an impeller. The housing has an accommodation space, an inlet, and an outlet. The inlet and the outlet are connected to the accommodation space. The impeller is located in the accommodation space. The heat pipe is configured to be in thermal contact with the heat source. The heat dissipater is located at the outlet and in thermal contact with the heat pipe. The heat conduction assembly includes a first part configured for the heat source to be mounted thereon and in thermal contact with the heat source, and a second part disposed on the housing and partially located in the accommodation space.

8 Claims, 4 Drawing Sheets

(51) Int. Cl.
*F28D 15/02* (2006.01)
*G06F 1/20* (2006.01)
*H01L 23/467* (2006.01)
*H05K 7/20* (2006.01)

(56) References Cited

U.S. PATENT DOCUMENTS

| | | | | |
|---|---|---|---|---|
| 2004/0245866 | A1* | 12/2004 | Lopatinsky | H01L 23/467 310/64 |
| 2005/0243511 | A1* | 11/2005 | Hata | G06F 1/203 361/679.47 |
| 2007/0068659 | A1* | 3/2007 | Hwang | H01L 23/467 165/121 |
| 2007/0204976 | A1* | 9/2007 | Uchimura | H01L 23/467 165/122 |
| 2007/0251675 | A1* | 11/2007 | Hwang | H01L 23/427 165/104.33 |
| 2008/0013285 | A1* | 1/2008 | Hung | H01L 23/427 361/719 |
| 2008/0019827 | A1* | 1/2008 | Hirata | F04D 29/4226 415/206 |
| 2008/0037227 | A1* | 2/2008 | Fujiwara | G06F 1/203 361/722 |
| 2008/0093056 | A1* | 4/2008 | Hwang | H01L 23/427 165/104.33 |

* cited by examiner

HEAT DISSIPATION SYSTEM

CROSS-REFERENCE TO RELATED APPLICATIONS

This non-provisional application claims priority under 35 U.S.C. § 119(a) on Patent Application No(s). 201910865546.6 filed in China, P.R.C. on Sep. 12, 2019, the entire contents of which are hereby incorporated by reference.

BACKGROUND OF THE INVENTION

Technical Field of the Invention

The present disclosure relates to a heat dissipation system, more particularly to a heat dissipation system having two approaches for thermal conduction.

Description of the Related Art

With the usage habit for the computers changes, laptop computers have become more and more popular. The reason for the laptop computer to become popular is that the laptop computer is lightweight, small, and easy to carry. Therefore, it is convenient to carry the laptop computer to commute or bring it to office or café for work, article viewing, clips watching or playing games. Some laptop computers are equipped with high end processors to improve gaming experience.

SUMMARY OF THE INVENTION

One embodiment of the present disclosure provides a heat dissipation system configured to be in thermal contact with a heat source. The heat dissipation system includes a centrifugal fan, a heat pipe, a heat dissipater, and a heat conduction assembly. The centrifugal fan includes a housing and an impeller. The housing has an accommodation space, an inlet, and an outlet. The inlet and the outlet are connected to the accommodation space. The impeller is located in the accommodation space. The heat pipe is configured to be in thermal contact with the heat source. The heat dissipater is located at the outlet and in thermal contact with the heat pipe. The heat conduction assembly includes a first part and a second part. The first part is configured for the heat source to be mounted thereon and in thermal contact with the heat source. The second part is disposed on the housing of the centrifugal fan and partially located in the accommodation space. The second part is in thermal contact with the first part.

BRIEF DESCRIPTION OF THE DRAWINGS

The present disclosure will become more fully understood from the detailed description given hereinbelow and the accompanying drawings which are given by way of illustration only and thus are not intending to limit the present disclosure and wherein.

DETAILED DESCRIPTION

Figure 1:
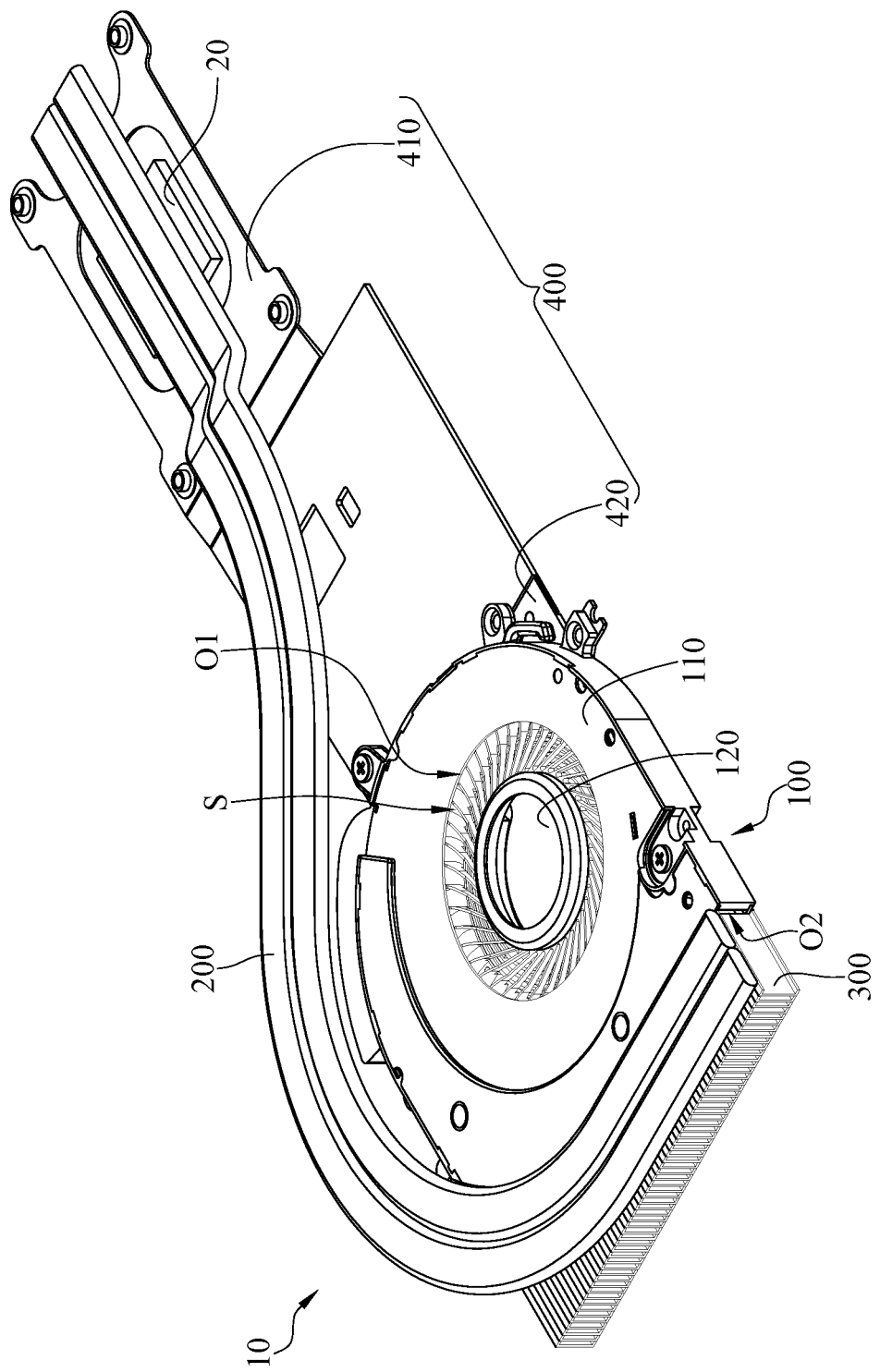
FIG. 1 is a perspective view of a heat dissipation system according to a first embodiment of the present disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Figure 2:
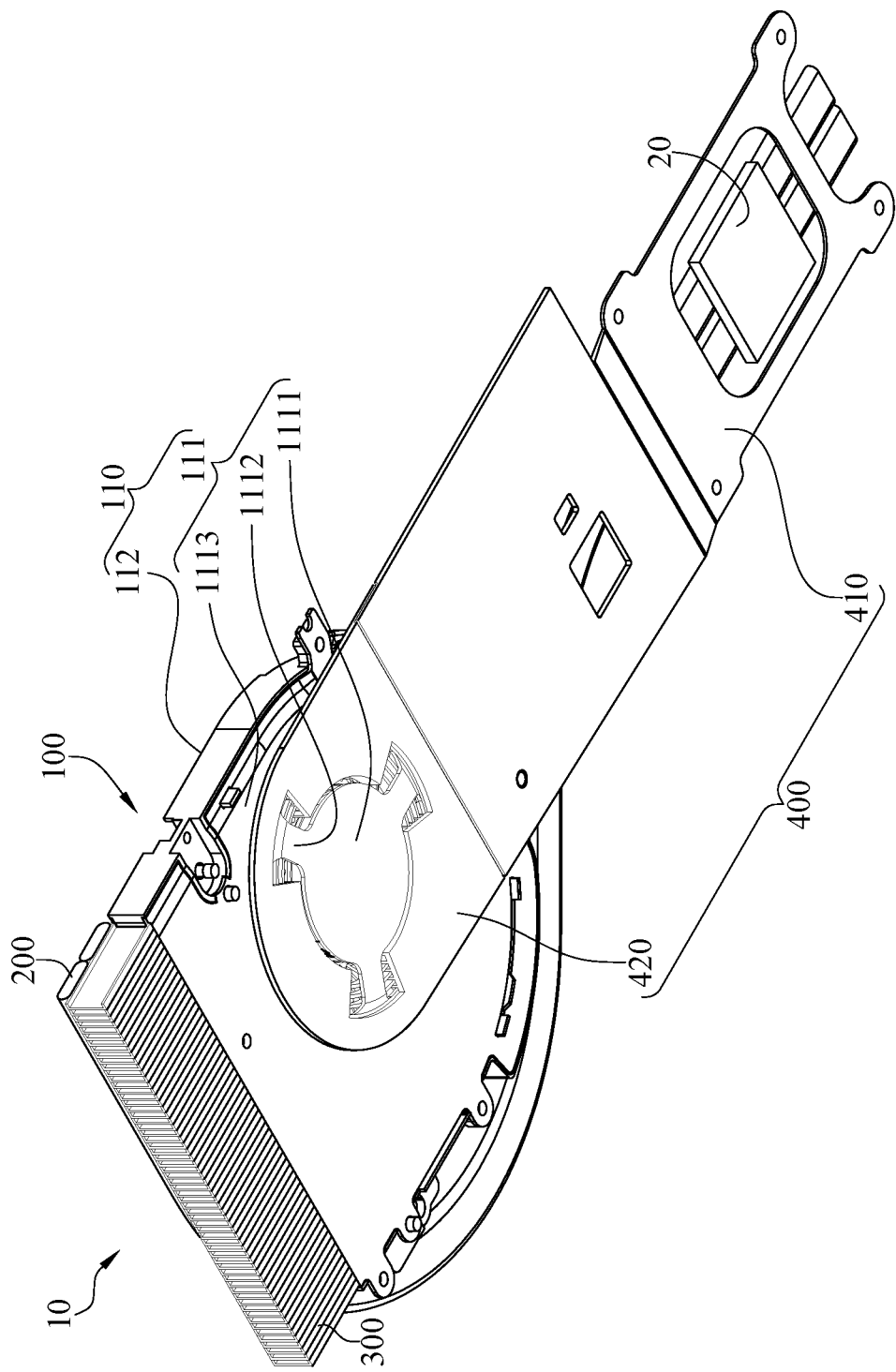
FIG. 2 is another perspective view of the heat dissipation system in FIG. 1.
Figure 3:
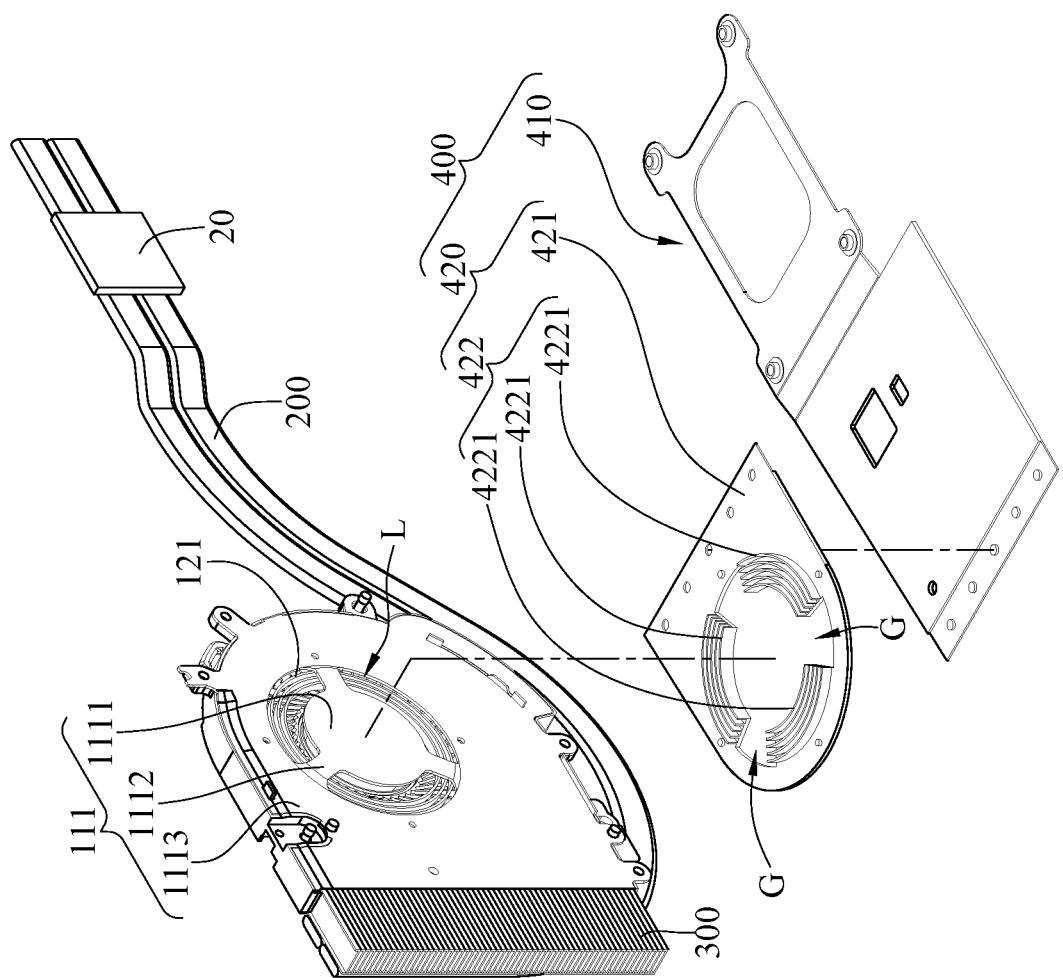
FIG. 3 is an exploded view of the heat dissipation system in FIG. 1.
Figure 4:
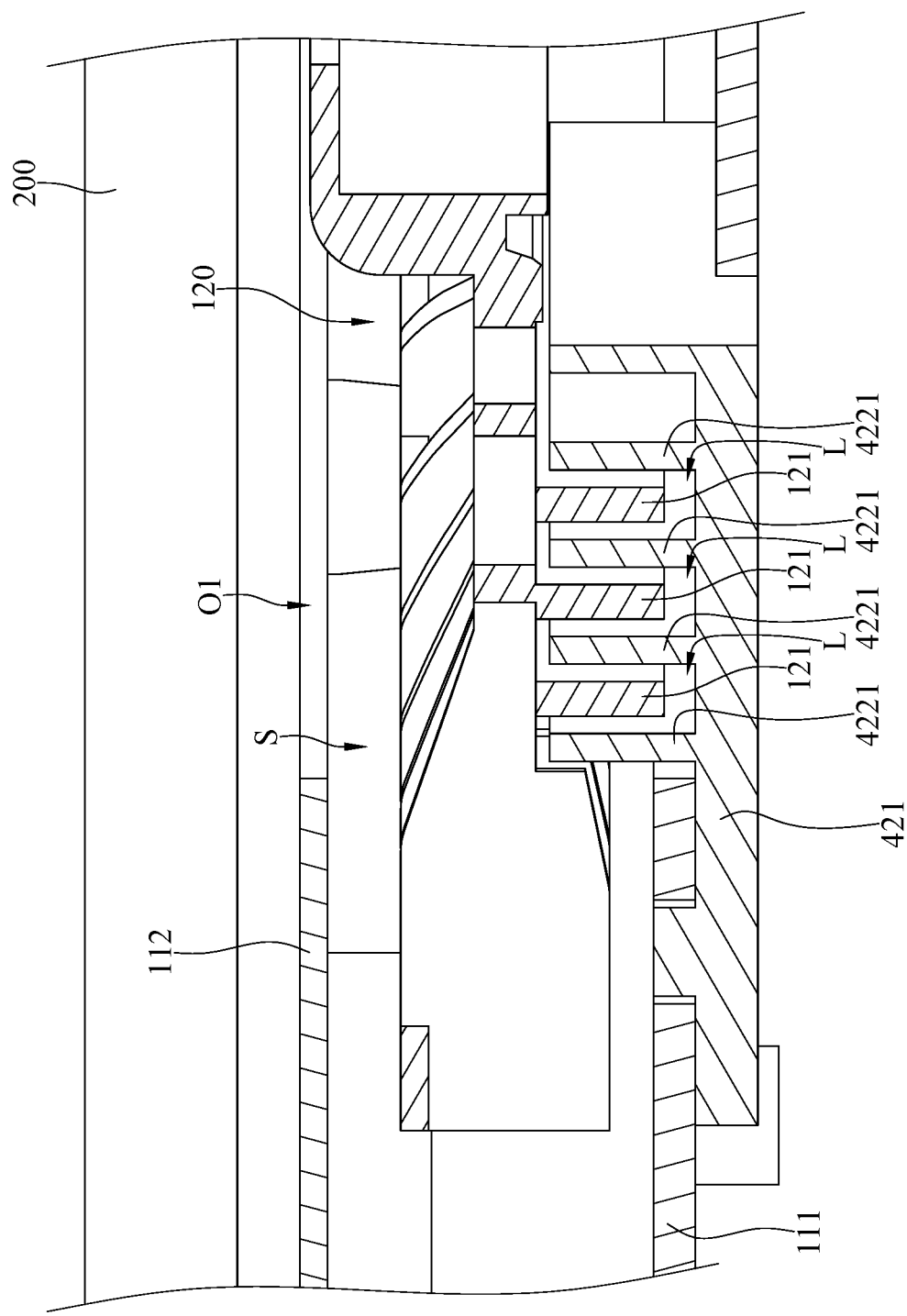
FIG. 4 is a partially cross-sectional view of the heat dissipation system in FIG. 1.

Please refer to FIG. 1 to FIG. 4. FIG. 1 is a perspective view of a heat dissipation system according to a first embodiment of the present disclosure. FIG. 2 is another perspective view of the heat dissipation system in FIG. 1. FIG. 3 is an exploded view of the heat dissipation system in FIG. 1. FIG. 4 is a partially cross-sectional view of the heat dissipation system in FIG. 1.

This embodiment provides a heat dissipation system 10 configured to be in thermal contact with a heat source 20. The heat source 20 may be a central processing unit or a graphics processing unit that can generate massive heat during operation. The heat dissipation system 10 includes a centrifugal fan 100, a heat pipe 200, a heat dissipater 300, and a heat conduction assembly 400.

The centrifugal fan 100 includes a housing 110 and an impeller 120. The housing 110 has an accommodation space S, an inlet O1, and an outlet O2. The inlet O1 and the outlet O2 are connected to the accommodation space S. Specifically, the housing 110 includes a bottom plate 111 and a cover plate 112. The bottom plate 111 includes a central portion 1111, a plurality of bridge portions 1112, and an outer portion 1113. The central portion 1111 is surrounded by and spaced apart from the outer portion 1113 and is connected to the outer portion 1113 via the bridges portions 1112. The bridge portions 1112 are spaced apart from one another by a slot L therebetween. The cover plate 112 is disposed on the outer portion 1113 of the bottom plate 111. The impeller 120 is located in the accommodation space S and rotatably disposed on the central portion 1111.

The heat pipe 200 is in thermal contact with the heat source 20. The heat dissipater 300 may be a heatsink. The heat dissipater 300 is located at the outlet O2 and in thermal contact with the heat pipe 200. The heat generated by the heat source 20 can be thermally conducted to the heat dissipater 300 via the heat pipe 200, and then the heat thermally conducted to the heat dissipater 300 can be taken away by the air flow generated by the centrifugal fan 100.

The heat conduction assembly 400 includes a first part 410 and a second part 420. The first part 410 is configured for the heat source 20 to be mounted thereon and in thermal contact with the heat source 20. The second part 420 is disposed on the housing 110 of the centrifugal fan 100 and partially located in the accommodation space S. The second part 420 is in thermal contact with the first part 410. Therefore, the heat generated by the heat source 20 can be further thermally conducted to the second part 420 via the first part 410 of the heat conduction assembly 400, and then the heat thermally conducted to the second part 420 can be taken away by the air flow generated by the centrifugal fan 100. In other words, there are two approaches for transferring the heat generated by the heat source 20, one is to transfer the heat via the heat pipe 200, and the other is to transfer the heat via the heat conduction assembly 400.

Conventionally, a heat source such as central processing unit is mounted on a back plate that cannot transfer heat to a fan. In the present disclosure, the first part 410 can be used as a back plate for the heat source 20 to be mounted thereon, and the first part 410 is also able to transfer the heat generated by the heat source 20 to the centrifugal fan 100 via the second part 420. The heat transferred to the centrifugal fan 100 can be taken away by the air flow generated by the centrifugal fan 100.

In this embodiment, the second part 420 includes a main plate 421 and a plurality of heat conduction parts 422. Each of the heat conduction parts 422 includes a plurality of curved sections 4221 protruding from the main plate 421. The curved sections 4221 are arranged in circle and spaced apart from one another by a gap G therebetween. The main plate 421 is disposed on a side of the bottom plate 111 facing away from the accommodation space S, and the bridge portions 1112 are respectively located in the gaps G. The impeller 120 includes a plurality of ring parts 121. The ring parts 121 and the curved sections 4221 are substantially concentric and are disposed side by side in the slots L.

The ring parts 121 and the curved sections 4221 are spaced apart from each other by a distance which is too small to form a boundary layer between the ring parts 121 and the curved sections 4221 during the operation of the centrifugal fan 100, so that the heat exchange between the ring parts 121 and the curved sections 4221 is similar to heat conduction rather than heat convection.

In this embodiment, the quantities of the heat conduction parts 422 and the ring parts 121 are not restricted. In some embodiments, the second part may only include one heat conduction part, and the impeller may only include one ring part.

In this embodiment, there are three bridge portions 1112 and three gaps G, but the present disclosure is not limited thereto. In some embodiments, the bottom plate may only include one bridge portion, and the curved sections may be spaced apart from each other by only one gap.

In this embodiment, the first part 410 and the second part 420 are riveted together, but the present disclosure is not limited thereto. In some embodiment, the first part and the second part may be detachably assembled together by a snap-fit joint.

In this embodiment, the second part 420 and the bottom plate 111 are two independent pieces, and the largest area of the main plate 421 of the second part 420 is smaller than the largest area of the bottom plate 111. Therefore, it is easier to get the second part 420 including the heat conduction parts 422 manufactured in high machining accuracy. If the heat conduction parts 422 were formed on the bottom plate 111 having a larger size, it might not be able to achieve the required machining accuracy of the heat conduction parts 422.

According to the heat dissipation system discussed above, the heat generated by the heat source can be thermally conducted to the heat dissipater via the heat pipe and to the second part via the first part of the heat conduction assembly. The heat thermally conducted to the heat dissipater and to the second part can be taken away by the air flow generated by the centrifugal fan. That is, there are two approaches for removing heat generated by the heat source, one is to transfer the heat via the heat pipe, and the other is to transfer the heat via the heat conduction assembly. Therefore, the heat dissipation efficiency of the heat dissipation system is improved.

The embodiments are chosen and described in order to best explain the principles of the present disclosure and its practical applications, to thereby enable others skilled in the art best utilize the present disclosure and various embodiments with various modifications as are suited to the particular use being contemplated. It is intended that the scope of the present disclosure is defined by the following claims and their equivalents.

What is claimed is:

1. A heat dissipation system, configured to be in thermal contact with
   a heat source, comprising:
   a centrifugal fan, comprising a housing and an impeller, wherein the housing comprises a bottom plate and a cover plate, the bottom plate comprises a central portion, an outer portion, and a plurality of bridge portions, the central portion is surrounded by and spaced apart from the outer portion and is connected to the outer portion via the plurality of bridge portions, the plurality of bridge portions are spaced apart from one another by a slot therebetween, the cover plate is disposed on the outer portion of the bottom plate, the housing has an accommodation space, an inlet, and an outlet, the inlet and the outlet are connected to the accommodation space, and the impeller is rotatably disposed on the central portion and located in the accommodation space;
   a heat pipe, configured to be in thermal contact with the heat source;
   a heat dissipater, located at the outlet, wherein the heat dissipater is in thermal contact with the heat pipe; and
   a heat conduction assembly, comprising a first part and a second part, wherein the first part is configured for the heat source to be mounted thereon and in thermal contact with the heat source, the second part is disposed on the housing of the centrifugal fan and partially located in the accommodation space, the second part is in thermal contact with the first part, the second part comprises a main plate and at least one heat conduction part, the at least one heat conduction part comprises a plurality of curved sections protruding from the main plate, the plurality of curved sections are arranged in circle, the plurality of curved sections are spaced apart from one another by a gap therebetween, the main plate is disposed on a side of the bottom plate facing away from the accommodation space, and the plurality of bridge portions are respectively located in the gaps.

2. The heat dissipation system according to claim 1, wherein a quantity of the plurality of bridge portions is three, and a quantity of the gaps is three.

3. The heat dissipation system according to claim 1, wherein the impeller comprises at least one ring part, and the at least one ring part and the plurality of curved sections are substantially concentric and are disposed side by side.

4. The heat dissipation system according to claim 3, wherein a quantity of the at least one heat conduction part is plural, and a quantity of the at least one ring part is plural.

5. The heat dissipation system according to claim 1, wherein the first part and the second part are detachably assembled together.

6. The heat dissipation system according to claim 5, wherein the first part and the second part are riveted together.

7. The heat dissipation system according to claim 5, wherein a largest area of the main plate of the second part is smaller than a largest area of the bottom plate of the housing.

8. The heat dissipation system according to claim 1, wherein the heat dissipater is a heatsink.

\* \* \* \* \*